(12) United States Patent
Jeon et al.

(10) Patent No.: US 11,315,894 B2
(45) Date of Patent: Apr. 26, 2022

(54) SEMICONDUCTOR STACK AND METHOD FOR MANUFACTURING THE SAME

(71) Applicant: Samsung Electronics Co., Ltd., Suwon-si (KR)

(72) Inventors: Hyungjun Jeon, Seoul (KR); Kwangjin Moon, Hwaseong-si (KR); Hakseung Lee, Seoul (KR); Hyoukyung Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 11 days.

(21) Appl. No.: 17/035,215

(22) Filed: Sep. 28, 2020

(65) Prior Publication Data

US 2021/0305186 A1  Sep. 30, 2021

(30) Foreign Application Priority Data

Mar. 26, 2020  (KR) .................. 10-2020-0036637

(51) Int. Cl.
| | |
|---|---|
| *H01L 25/065* | (2006.01) |
| *H01L 23/00* | (2006.01) |
| *H01L 21/683* | (2006.01) |
| *H01L 21/78* | (2006.01) |
| *H01L 25/00* | (2006.01) |

(52) U.S. Cl.
CPC .......... *H01L 24/08* (2013.01); *H01L 21/6835* (2013.01); *H01L 21/78* (2013.01); *H01L 24/80* (2013.01); *H01L 25/0657* (2013.01); *H01L 25/50* (2013.01); *H01L 2221/68327* (2013.01); *H01L 2224/08145* (2013.01); *H01L 2224/80006* (2013.01); *H01L 2224/80895* (2013.01); *H01L 2224/80896* (2013.01)

(58) Field of Classification Search
CPC ..... H01L 24/08; H01L 21/6835; H01L 21/78; H01L 24/80; H01L 25/0657; H01L 25/50; H01L 2221/68327; H01L 2224/08145; H01L 2224/80006; H01L 2224/80895; H01L 2224/80896; H01L 21/561; H01L 21/568; H01L 23/3121; H01L 23/3135; H01L 23/12; H01L 23/495

See application file for complete search history.

(56) References Cited

U.S. PATENT DOCUMENTS

| | | |
|---|---|---|
| 6,555,906 B2 | 4/2003 | Towle et al. |
| 7,169,691 B2 | 1/2007 | Doan |
| 7,867,820 B2 | 1/2011 | Burrell et al. |
| 7,923,349 B2 | 4/2011 | McElrea et al. |
| 7,973,314 B2 | 7/2011 | Yang et al. |
| 8,470,689 B2 | 6/2013 | Desplobain et al. |
| 9,000,599 B2 | 4/2015 | Raorane et al. |
| 10,128,213 B2 | 11/2018 | Yu et al. |
| 10,297,586 B2 | 5/2019 | Or-Bach et al. |
| 2019/0140133 A1 | 5/2019 | Chen et al. |
| 2019/0214367 A1* | 7/2019 | Chen .................. H01L 21/4853 |

* cited by examiner

*Primary Examiner* — Elias Ullah
(74) *Attorney, Agent, or Firm* — Muir Patent Law, PLLC

(57) ABSTRACT

A semiconductor stack and a method for manufacturing the same are disclosed. The semiconductor stack includes a lower chip, an upper chip disposed over the lower chip, an upper lateral-side passivation layer surrounding side surfaces of the upper chip, and a plurality of bonding pads and a bonding passivation layer disposed between the upper chip and the lower chip.

21 Claims, 10 Drawing Sheets

SEMICONDUCTOR STACK AND METHOD FOR MANUFACTURING THE SAME

CROSS-REFERENCE TO THE RELATED APPLICATION

This application claims priority from Korean Patent Application No. 10-2020-0036637, filed on Mar. 26, 2020, in the Korean Intellectual Property Office, the disclosure of which is incorporated herein by reference in its entirety.

BACKGROUND

1. Field

The exemplary embodiments of the disclosure relate to a semiconductor stack in which upper chips are attached to a carrier wafer, and an upper lateral-side passivation layer is disposed at side surfaces of the upper chips and between adjacent ones of the upper chips, thereby being capable of controlling a wafer bonding interface, achieving redistribution of the upper chips, and preventing degradation in wafer bonding yield. Exemplary embodiments include a method for manufacturing the semiconductor stack.

2. Description of the Related Art

In conventional wafer-to-wafer (W2 W) bonding, an upper wafer and a lower wafer, which have the same chip size and the same chip arrangement, are bonded to each other. In this case, degradation in rolled throughput yield after bonding may inevitably occur due to a yield difference between the upper and lower wafers, and a position difference of known good dies (KGDs) on the upper and lower wafers. Even when any one of the die on the upper wafer and the die on the lower wafer is defective, a semiconductor stack disposed at a position corresponding to the defective die after wafer bonding may be defective. When die-to-wafer (D2 W) technology is applied in order to avoid such accumulated failure, only KGDs may be sorted from the chips of the upper wafer, and may then be attached to the lower wafer. In this case, however, there may be a problem in that process stability for fine pitch may be degraded. Furthermore, when D2 W collective bonding is carried out, chips are attached by an adhesive. In this case, a flat bonding interface may not be formed due to an adhesive height difference even when the chips are identical. Therefore, a technology capable of enhancing yield and efficiency of wafer bonding is desirable.

SUMMARY

Some exemplary embodiments of the disclosure provide a semiconductor stack in which only upper chips having no defect are sorted and attached to a carrier wafer, and an upper lateral-side passivation layer is disposed at side surfaces of the upper chips and between adjacent ones of the upper chips, thereby being capable of controlling a bonding interface to be flat, and enhancing rolled throughput yield thereof, and a method for manufacturing the semiconductor stack.

Some exemplary embodiments of the disclosure also provide a semiconductor stack in which a gap between adjacent upper chips is filled with an upper lateral-side passivation layer, and bonding pads and a bonding passivation layer are formed on an upper surface of the resultant structure through a redistribution layer formation process or the like, thereby being capable of achieving hetero bonding between different kinds of chips, and disposing a bonding pad even in a gap area between adjacent ones of the upper chips, and a method for manufacturing the semiconductor stack.

In addition, some exemplary embodiments of the disclosure provide a semiconductor stack using a carrier wafer including a wafer cutting interface, thereby being capable of achieving smart cutting or stealth cutting of the carrier wafer while eliminating use of an adhesive upon attaching an upper chip to the carrier wafer, thereby enabling a desired process to be carried out at a higher temperature, and a method for manufacturing the semiconductor stack.

A semiconductor stack according to an embodiment of the disclosure may include a lower chip, an upper chip disposed over the lower chip, an upper lateral-side passivation layer surrounding a side surface of the upper chip, and a plurality of bonding pads and a bonding passivation layer disposed between the upper chip and the lower chip.

A semiconductor stack according to an embodiment of the disclosure may include a first chip, a second chip disposed over the first chip, a first lateral-side passivation layer surrounding a side surface of the second chip, a plurality of first bonding pads and a first bonding passivation layer disposed between the first chip and the second chip, a third chip disposed over the second chip, a second lateral-side passivation layer surrounding a side surface of the third chip, and a plurality of bonding pads and a second bonding passivation layer disposed between the second chip and the third chip.

A semiconductor stack according to an embodiment of the disclosure may include a first chip, a second chip, and a third chip stacked on one another, a first lateral-side passivation layer surrounding a side surface of the second chip, a plurality of first bonding pads and a first bonding passivation layer disposed between the first chip and the second chip, and a second lateral-side passivation layer surrounding a side surface of the first lateral-side passivation layer surrounding the side surface of the second chip, a side surface of the first bonding passivation layer, and a side surface of the first chip.

In a semiconductor stack according to various exemplary embodiments of the disclosure, only upper chips having no defect are sorted and attached to a carrier wafer, and an upper lateral-side passivation layer is disposed at side surfaces of the upper chips while being filled between adjacent ones of the upper chips, and, as such, it may be possible to control a wafer bonding interface to be flat and to achieve an enhancement in rolled throughput yield of the semiconductor stack. In addition, a redistribution layer formation process may be conducted on upper surfaces of the upper chips and, as such, hetero bonding between different kinds of chips may be possible. Furthermore, disposition of bonding pads may be extended to a gap area between adjacent ones of the upper chips.

In addition, in a method for manufacturing a semiconductor stack in accordance with various exemplary embodiments of the disclosure, a carrier wafer, which includes a wafer cutting interface enabling smart cutting or stealth cutting, is used, and, as such, it may be possible to eliminate use of an adhesive upon attaching an upper chip to the carrier wafer, thereby enabling a desired process to be carried out at a higher temperature.

DETAILED DESCRIPTION OF EXEMPLARY EMBODIMENTS

Figure 1:
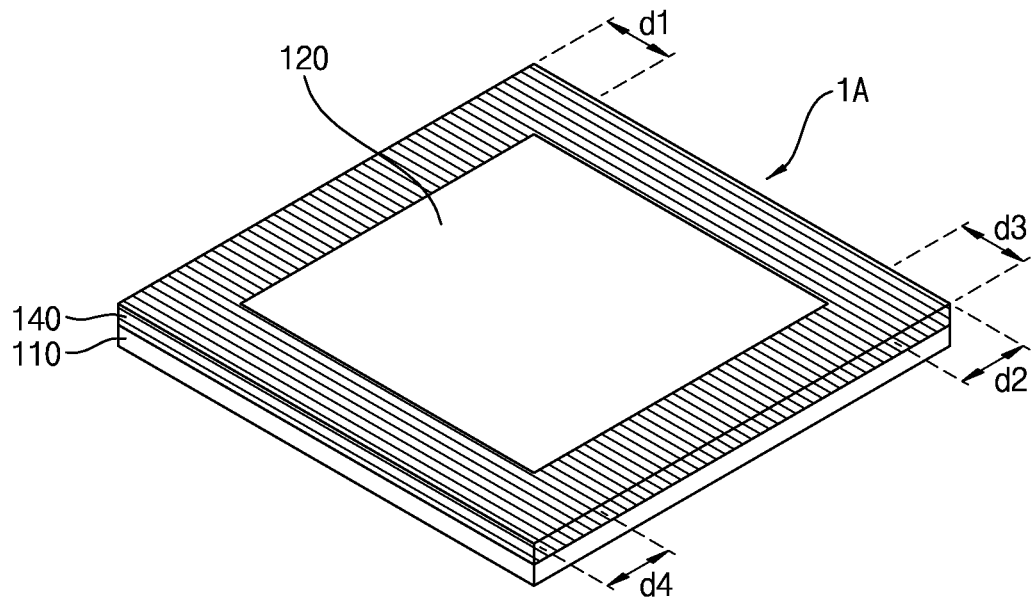
FIGS. 1, 2, and 3 are views illustrating semiconductor stacks 1A, 1B, and 1C according to various exemplary embodiments of the disclosure, respectively.
Figure 2:
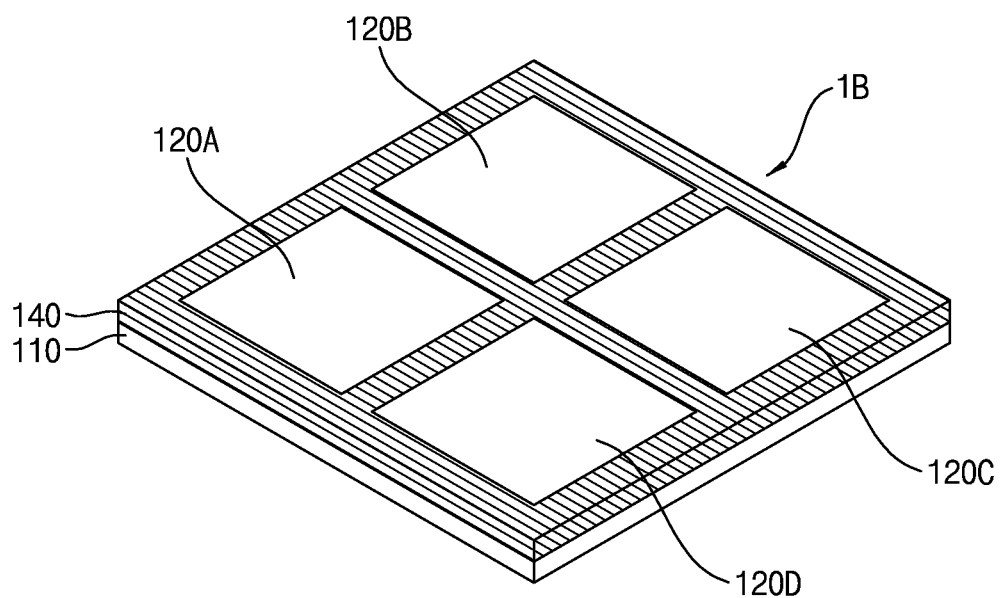
Figure 3:
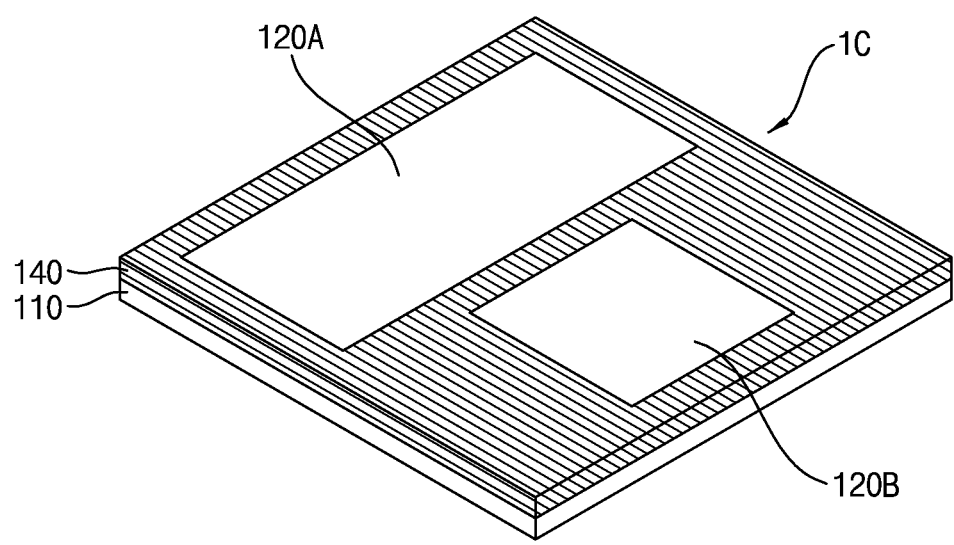

FIGS. 1, 2, and 3 are views illustrating semiconductor stacks 1A, 1B, and 1C according to various exemplary embodiments of the disclosure, respectively.

Referring to FIG. 1, the semiconductor stack 1A according to one exemplary embodiment of the disclosure includes a lower chip 110, an upper chip 120 disposed over the lower chip 110, and an upper lateral-side passivation layer 140 surrounding a side surface of the upper chip 120. A lower surface of the upper chip 120 may have a smaller area than an upper surface of the lower chip 110. The upper chip 120 and the lower chip 110 may include different semiconductor chips, respectively. Each semiconductor chip may be, for example, a die including an integrated circuit formed from a wafer. The term "semiconductor device" may be generally used herein to refer to a semiconductor chip, or to a semiconductor chip stack, such as semiconductor stack 1A. The term "chip" used herein (without being preceded by "semiconductor") may refer to a single semiconductor chip or a plurality of semiconductor chips, for example that are stacked together or disposed at the same vertical level and horizontally separate from each other as part of a package. The semiconductor stacks described herein may also be referred to as semiconductor chip stacks or semiconductor device stacks.

The upper lateral-side passivation layer 140 may partially or completely surround the side surfaces of the upper chip 120. For example, a side surface may be a surface extending vertically in a direction perpendicular to the upper surface of the lower chip 110 or the lower surface of the upper chip 120. When viewed in a top-down (e.g., plan) view, the upper lateral-side passivation layer 140 may have a frame shape. Four edges, also described as edge portions or sides of the upper lateral-side passivation layer 140, which has a frame shape, may have widths of d1, d2, d3, and d4, respectively. d1, d2, d3, and d4 may have the same numerical value. In an embodiment, d1, d2, d3, and d4 may be different. The upper lateral-side passivation layer 140 may be formed through a deposition process or a spin-coating process. The upper lateral-side passivation layer 140 may include a passivation layer made of $SiO_2$, SiN, SiCN, polyimide, SiLK, or spin-on-glass (SOG). Side surfaces (e.g., inner side surfaces) of the upper lateral-side passivation layer 140 may contact the side surfaces (e.g., outer side surfaces) of the upper chip 120. These side surfaces may also be referred to as side walls, or walls. As described herein, the term "contact" refers to a direct connection (e.g., touching).

The upper chip 120 may be a single semiconductor chip, or may include a plurality of semiconductor chips arranged in parallel, such as horizontally adjacent to each other. Referring to FIG. 2, the upper chip 120 may include a first upper chip 120A, a second upper chip 120B, a third upper chip 120C and a fourth upper chip 120D disposed in a matrix. Each of the first upper chip 120A, the second upper chip 120B, the third upper chip 120C, and the fourth upper chip 120D may be, for example, a semiconductor chip. The first upper chip 120A, the second upper chip 120B, the third upper chip 120C and the fourth upper chip 120D may include the same kind or type of semiconductor chips, respectively. In some embodiments, at least one of the first upper chip 120A, the second upper chip 120B, the third upper chip 120C or the fourth upper chip 120D is a semiconductor chip different from (e.g., a different kind or type from) those of the remaining ones. At least one pair of the first upper chip 120A, the second upper chip 120B, the third upper chip 120C and the fourth upper chip 120D may include the same kind or type of semiconductor chips. Different kinds or types of semiconductor chips described herein may refer to chips having different functions (e.g., memory versus controller) or chips having the same general functions but of a different type (e.g., different types of memory chips such as DRAM, MRAM, flash memory, etc.). Referring to FIG. 2, the upper lateral-side passivation layer 140 may be disposed at side surfaces of the upper chip 120A, 120B, 120C, and 120D and between adjacent ones of the upper chip 120A, 120B, 120C, and 120D. Side surfaces of the upper lateral-side passivation layer 140 may contact the side surfaces of the upper chips 120A, 120B, 120C, and 120D.

Referring to FIG. 3, the upper chip 120 may include a first upper chip 120A and a second upper chip 120B. Each of the first upper chip 120A and second upper chip 120B may be, for example, a semiconductor chip. The first upper chip 120A and the second upper chip 120B may be different in terms of size and kind, and may include different kinds of semiconductor chips, respectively. In an exemplary embodiment of the disclosure, wafer bonding may be possible between different kinds of semiconductor chips. Referring to FIG. 3, the upper lateral-side passivation layer 140 may be disposed at side surfaces of the upper chips 120A and 120B and between the upper chips 120A and 120B.

FIGS. 4, 5, 6A, 6B, 7 and 8 are views illustrating cross-sections of a semiconductor stack 1A and semiconductor stacks 1D to 1H, respectively.

Figure 4:
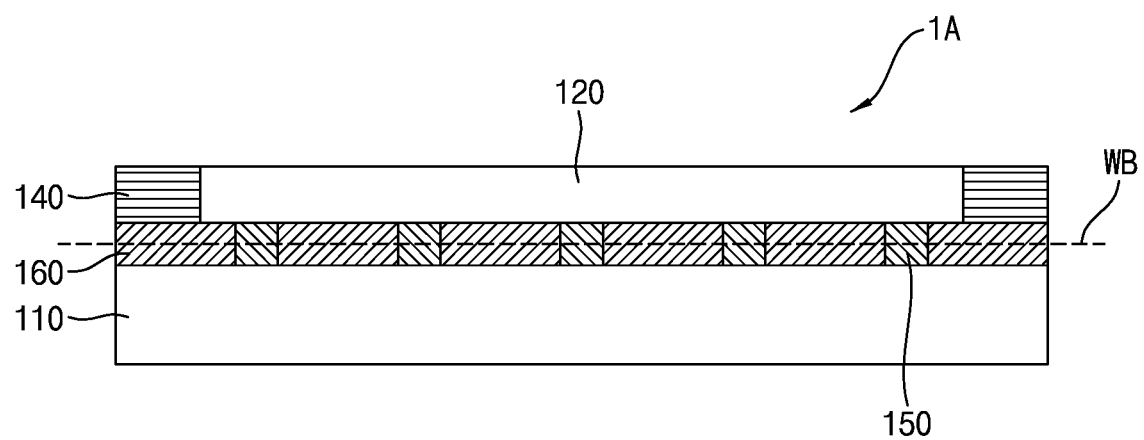
FIGS. 4, 5, 6A, 6B, 7 and 8 are views illustrating cross-sections of a semiconductor stack 1A and semiconductor stacks 1D to 1H, respectively.

Referring to FIG. 4, the semiconductor stack 1A according to one exemplary embodiment of the disclosure may further include a plurality of bonding pads 150 disposed between the upper chip 120 and the lower chip 110, and a bonding passivation layer 160. A portion of the bonding passivation layer 160 may be disposed between the upper lateral-side passivation layer 140 and the lower chip 110. The bonding pads 150 may be or may include metal such as copper (Cu). The bonding passivation layer 160 may be or may include a silicon-based insulating material such as silicon oxide or silicon nitride.

The upper chip 120 and the lower chip 110 may be hybrid-bonded to each other by the bonding pads 150 and the bonding passivation layer 160. Referring to FIG. 4, the bonding pads 150 of the upper chip 120 and the bonding pads 150 of the lower chip 110 may be bonded to each other (e.g., directly bonded to each other) in a copper (Cu)-to-copper (Cu) (C2C) bonding manner at a wafer bonding interface (WB) level. The C2C bonding may be more generally described as metal-to-metal bonding, where for example, the same metal us used for each bonding pad. The bonding may occur, for example, by atoms or molecules of the same type bonding to each other at the atomic or molecular level. The bonding may result in a bonding interface between the bonding pads 150 of the upper chip 120 and the bonding pads 150 of the lower chip 110. The bonding passivation layer 160 of the upper chip 120 and the bonding passivation layer 160 of the lower chip 110 may be bonded to each other (e.g., directly bonded to each other) in a dielectric-to-dielectric (D2D) bonding manner at the wafer bonding interface (WB) level. The bonding may likewise result in a bonding interface between the bonding passivation layer 160 of the upper chip 120 and the bonding passivation layer 160 of the lower chip 110. Accordingly, a set of first bonding pads for the upper chip may be respectively bonded to a set of second bonding pads for the lower chip, and a first bonding passivation layer for the upper chip may be bonded to a second bonding passivation layer for the lower chip.

The upper chip 120 and the lower chip 110 may be electrically connected via the pads 150. Referring to FIGS. 3 and 4, when the upper chip 120 includes the first upper chip 120A and the second upper chip 120B, the first upper chip 120A and the second upper chip 120B may be redistributed and electrically connected to each other via the bonding pads 150.

Figure 5:
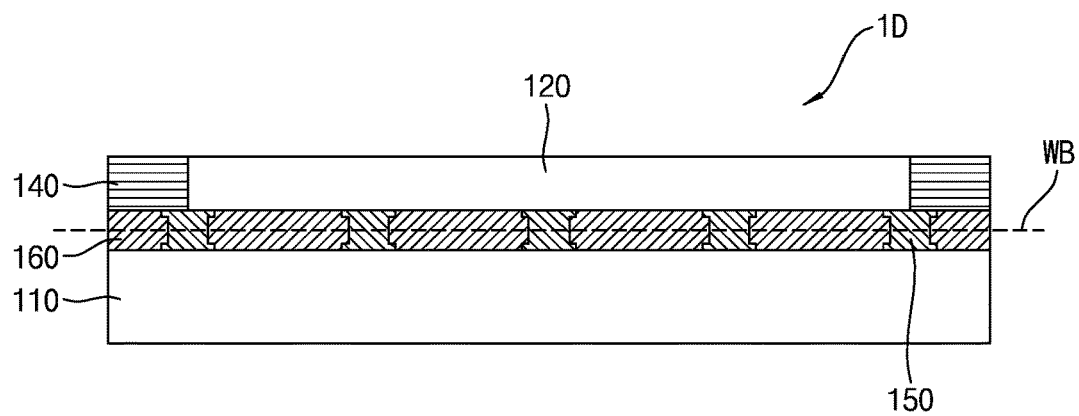

Referring to FIG. 5, at least some of or at least a portion of one or more of the bonding pads 150 may be disposed outside an area where the upper chip 120 is disposed, when viewed in a top-down view. The bonding pads 150 and the bonding passivation layer 160 may be formed through a redistribution layer (RDL) formation process included in a fabrication (FAB) process. The RDL formation process may include a wafer-level process. Referring to FIG. 5, in an exemplary embodiment of the disclosure, the bonding pads 150 may be disposed not only in an area between the upper chip 120 and the lower chip 110, but also in an area between the upper lateral-side passivation layer 140 disposed at the side surface of the upper chip 120 and the lower chip 110. Formation of a redistribution layer may be possible and, as such, the area occupied by each of the bonding pads 150 and/or by a region occupied by a shape formed by the bonding pads 150 may extend to outside of the area of the upper chip 120 when viewed in a top view.

Figure 6A:
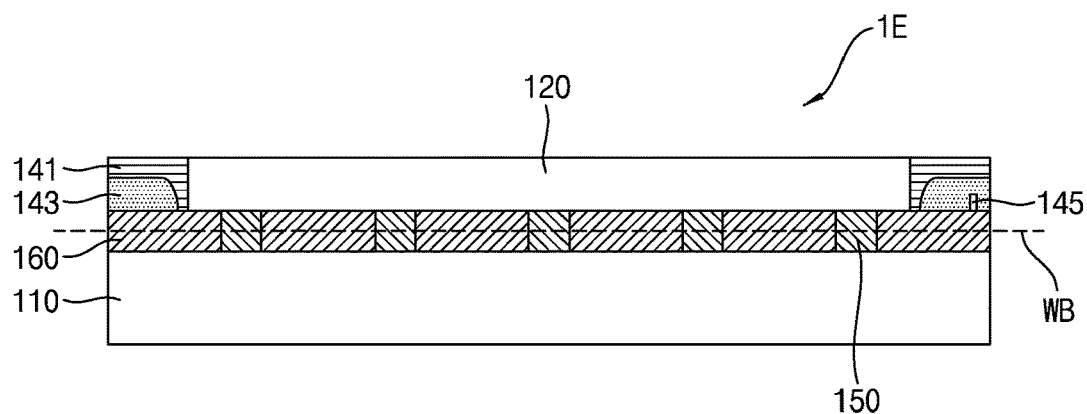
Figure 6B:
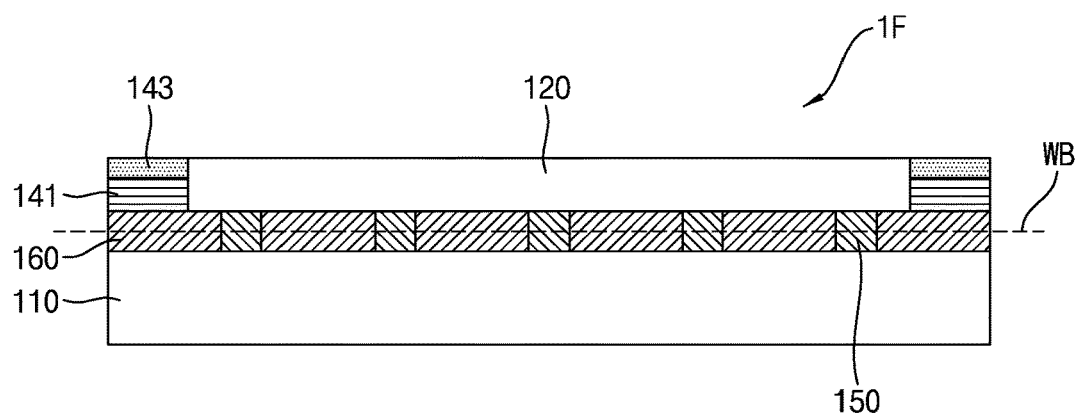

Referring to FIGS. 6A and 6B, the upper lateral-side passivation layer 140 may include a first upper lateral-side passivation layer 141 and a second upper lateral-side passivation layer 143. Each of 141 and 143 may be referred to as sub-layers as well. In an embodiment, the upper lateral-side passivation layer 140 may be constituted by a multi-layer structure of two or more layers, for example formed to have an interface or boundary therebetween. When the upper lateral-side passivation layer 140 is constituted by a multi-layer structure, the total stiffness thereof may increase and, as such, warpage of the semiconductor stack may be prevented. The upper lateral-side passivation layer 140, which has a multilayer structure, may be formed through repeated execution of a deposition process or a spin-coating process.

Referring to FIG. 6A, the first upper lateral-side passivation layer 141 may surround one side surface and an upper surface of the second upper lateral-side passivation layer 143 when viewed in a top view. In an embodiment, the first upper lateral-side passivation layer 141 and the second upper lateral-side passivation layer 143 may be formed through a sequential deposition process. In the deposition process, a deposition layer is formed in a direction perpendicular to a deposition surface (e.g., a side surface of the upper chip 120 and an upper surface of the semiconductor stack 1E in FIG. 6A). For example, the first upper lateral-side passivation layer 141 may be deposited on the side of the upper chip 120, and the second upper lateral-side passivation layer 143 on the side of the first upper lateral-side passivation layer 141 may be deposited in sequence. In addition, a seam may be formed at a portion of the deposition layer. Each of the first upper lateral-side passivation layer 141 and the second upper lateral-side passivation layer 143 formed through the deposition process may include oxide such as $SiO_2$ or nitride such as SiN or SiCN. In an embodiment, an upwardly-recessed trench or seam may be formed at a part of a lower portion of the second upper lateral-side passivation layer 143.

Referring to FIG. 6B, the first upper lateral-side passivation layer 141 may be disposed beneath the second upper lateral-side passivation layer 143 when viewed in vertical cross-section. For example, the first upper lateral-side passivation layer 141 may be disposed between the second upper lateral-side passivation layer 143 and the bonding passivation layer 160. For example, in FIG. 6B, the first upper lateral-side passivation layer 141 is not formed on a side surface of the second upper lateral-side passivation layer 143. In an embodiment, the second upper lateral-side passivation layer 143 and the first upper lateral-side passivation layer 141 may be formed through a sequential spin-coating process. The surface of a coating layer formed through the spin-coating process may be relatively parallel to a horizontal surface. In this case, each of the first upper lateral-side passivation layer 141 and the second upper lateral-side passivation layer 143 may include a passivation layer made of polymer such as polyimide (PI) or SiLK or a passivation layer made of spin-on-glass (SOG).

Figure 7:
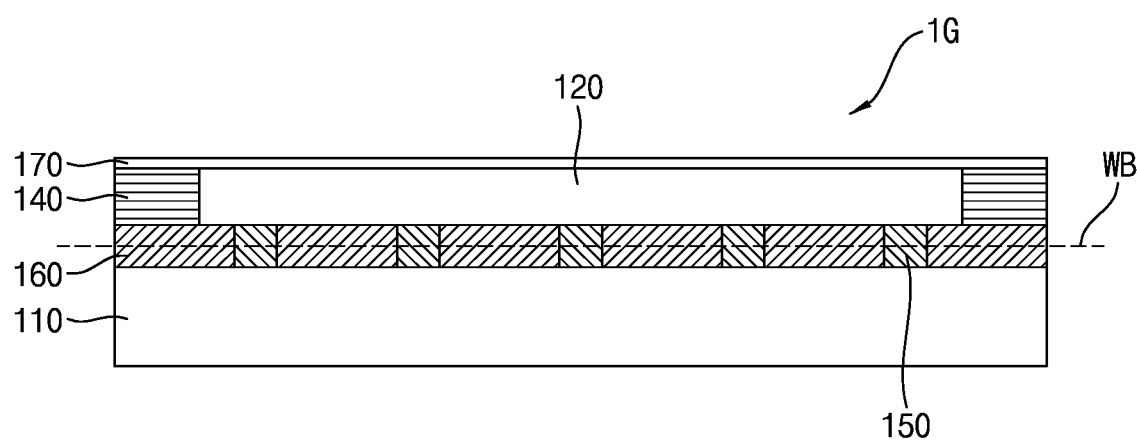

Referring to FIG. 7, the semiconductor stack 1G according to another exemplary embodiment of the disclosure may further include an upper backside passivation layer 170 disposed over the upper chip 120 and the upper lateral-side passivation layer 140. The upper backside passivation layer 170 may include a dielectric layer including nitride or oxide. Back surfaces of the upper backside passivation layer 170 and the upper chip 120 may be bonded to each other in a fusion bonding manner. Fusion bonding or direct bonding represents a wafer bonding process using no intermediate layer. Such a bonding process is based on chemical coupling between two surfaces of materials to be coupled, In an exemplary embodiment of the disclosure, back surfaces of the upper backside passivation layer 170 including oxide and the upper chip 120 may be bonded to each other in a fusion bonding manner. In an embodiment, the upper backside passivation layer 170 and the upper lateral-side passivation layer 140 may include the same material.

Figure 8:
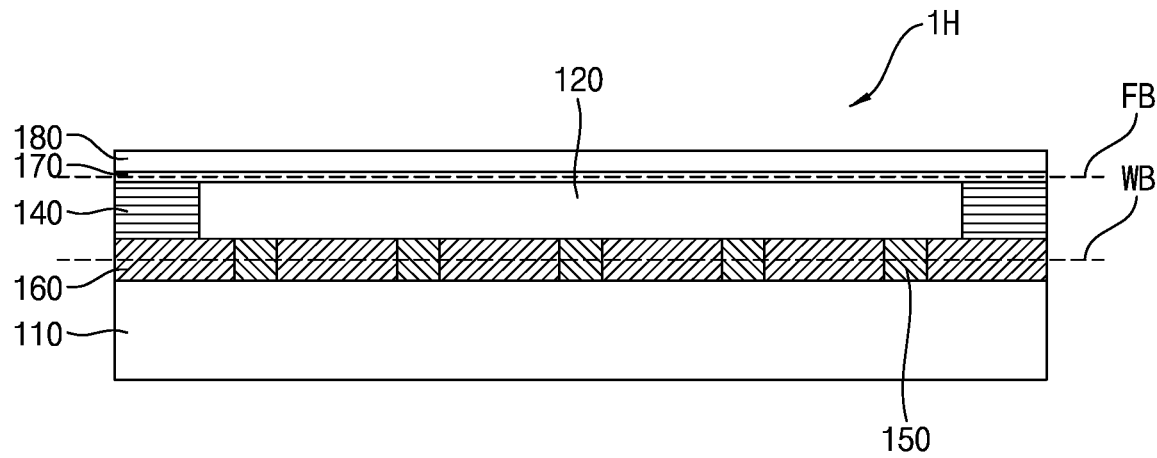

Referring to FIG. 8, the semiconductor stack 1H according to another exemplary embodiment of the disclosure may further include an upper backside silicon layer 180 disposed over the upper backside passivation layer 170. The upper backside silicon layer 180 may include silicon. The upper backside passivation layer 170 disposed between the upper backside silicon layer 180 and the upper chip 120 may include a fusion-bonding interface (FB). For example, in an embodiment, the upper chip 120 may include, at a back surface thereof, a sandwich structure of silicon (silicon included in the upper chip 120), a dielectric layer (the upper backside passivation layer 170), and silicon (silicon included in the upper backside silicon layer 180).

Figure 9:
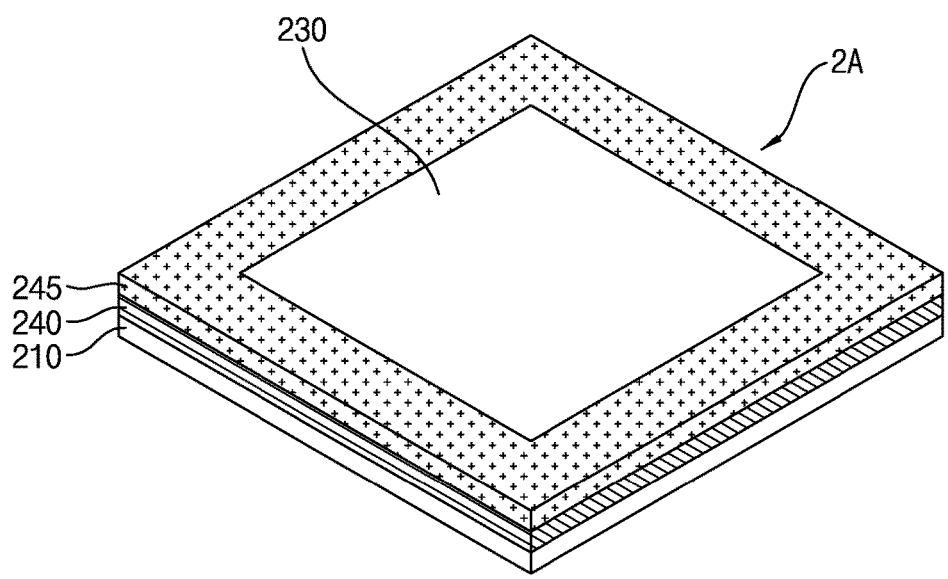
FIG. 9 is a view illustrating a semiconductor stack 2A according to an exemplary embodiment of the disclosure.
Figure 10:
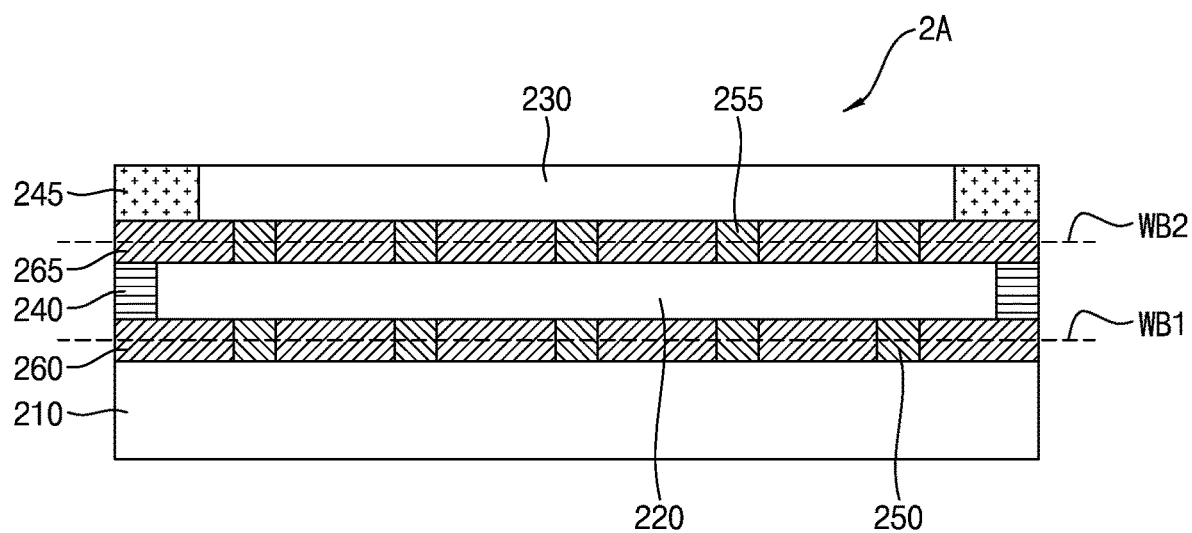
FIGS. 10, 11, and 12 are views illustrating cross-sections of semiconductor stacks 2A, 2B, and 2C according to various exemplary embodiments of the disclosure, respectively.
Figure 11:
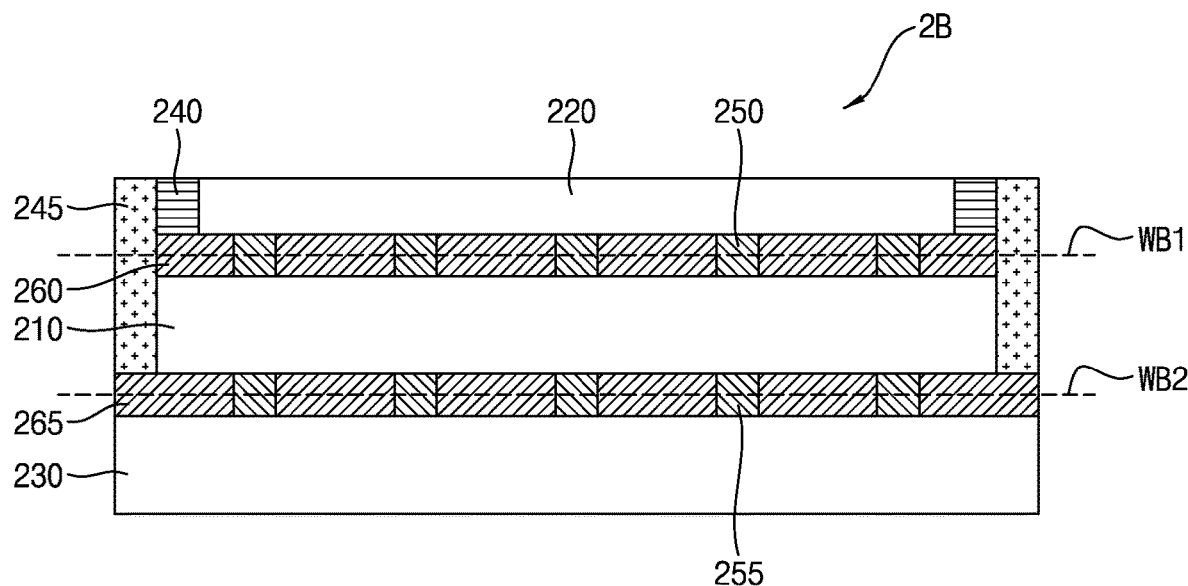
Figure 12:
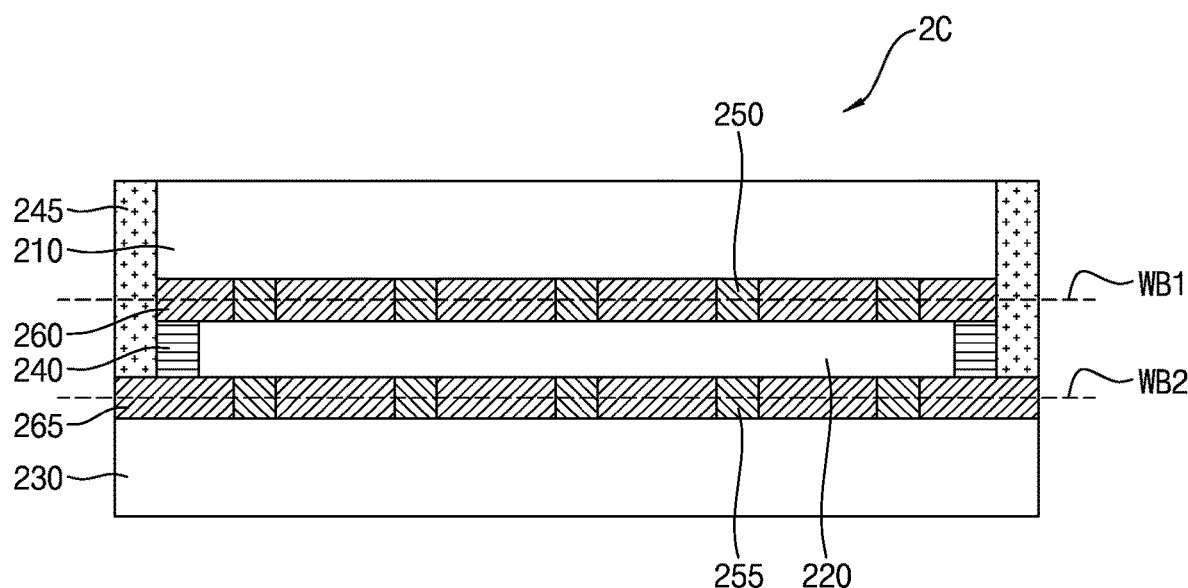

FIG. 9 is a view illustrating a semiconductor stack 2A according to an exemplary embodiment of the disclosure. FIGS. 10, 11, and 12 are views illustrating cross-sections of semiconductor stacks 2A, 2B, and 2C according to various exemplary embodiments of the disclosure, respectively.

Referring to FIGS. 9 and 10, the semiconductor stack 2A according to the illustrated exemplary embodiment of the disclosure may include a first chip 210, a second chip 220, a third chip 230, a first lateral-side passivation layer 240, a second lateral-side passivation layer 245, first bonding pads 250, second bonding pads 255, a first bonding passivation layer 260, and a second bonding passivation layer 265. The semiconductor stack 2A according to the illustrated exemplary embodiment of the disclosure may include at least three stacked semiconductor chips. The second chip 220 may include a through-silicon via (TSV), generally described as a through-substrate via, for electrical connection among the semiconductor chips. The first lateral-side passivation layer 240 may also include a via for electrical connection among the semiconductor chips.

Referring to FIGS. 9 and 10, the second chip 220 may be disposed over the first chip 210. The first lateral-side passivation layer 240 may surround and may contact a side surface of the second chip 220. The first bonding pads 250 and the first bonding passivation layer 260 may be disposed between the first chip 210 and the second chip 220. A portion of the first bonding passivation layer 260 may be disposed between the first chip 220 and the first lateral-side passivation layer 240. The third chip 230 may be disposed over the second chip 220. The second lateral-side passivation layer 245 may surround and may contact a side surface of the third chip 230. The second bonding pads 255 and the second bonding passivation layer 265 may be disposed between the second chip 220 and the third chip 230. A portion of the second bonding passivation layer 265 may be disposed between the second chip 220 and the second lateral-side passivation layer 245 and between the first lateral-side passivation layer 240 and the second lateral-side passivation layer 245. The various layers may be formed of materials such as described previously for similar structures.

In an embodiment, an upper surface of the first chip 210 may have a greater area than a lower surface of the second chip 220. An upper surface of the second chip 220 may have a greater area than a lower surface of the third chip 230. In an embodiment, the second chip 220 may include a plurality of identical or different chips disposed in parallel at the same vertical level, for example, to be horizontally separate from each other. The third chip 230 may also include a plurality of identical or different chips disposed in parallel at the same vertical level.

In an embodiment (not shown), the lower surface of the third chip 230 may have a greater area than the upper surface of the second chip 220. In this case, a portion of the second bonding passivation layer 265 may be disposed between the first lateral-side passivation layer 240 and the third chip 230.

The first chip 210 and the second chip 220 may be hybrid-bonded to each other by the first bonding pads 250 and the first bonding passivation layer 260. Referring to FIG. 10, the first bonding pads 250 of the first chip 210 and the first bonding pads 250 of the second chip 220 may be bonded to each other in a C2C bonding manner at a first wafer bonding interface (WB1) level. In addition, the first bonding passivation layer 260 of the first chip 210 and the first bonding passivation layer 260 of the second chip 220 may be bonded to each other in a D2D bonding manner.

Similarly, the second chip 220 and the third chip 230 may be hybrid-bonded to each other by the second bonding pads 255 and the second bonding passivation layer 265. Referring to FIG. 10, the second bonding pads 255 of the second chip 210 and the second bonding pads 255 of the third chip 230 may be bonded to each other in a C2C bonding manner at a second wafer bonding interface (WB2) level. In addition, the second bonding passivation layer 265 of the second chip 220 and the second bonding passivation layer 265 of the third chip 230 may be bonded to each other in a D2D bonding manner.

Referring to FIGS. 11 and 12, each of the semiconductor stacks 2B and 2C according to the illustrated exemplary embodiments of the disclosure may include a first chip 210, a second chip 220 and a third chip 230, which are stacked in an optional order, while including a first lateral-side passivation layer 240, a second lateral-side passivation layer 245, first bonding pads 250, and a first bonding passivation layer 260. The first lateral-side passivation layer 240 may surround the second chip 220. The first bonding pads 250 and the first bonding passivation layer 260 may be disposed between the first chip 210 and the second chip 220. A portion of the first bonding passivation layer 260 may be disposed between the first chip 210 and the first lateral-side passivation layer 240. The second lateral-side passivation layer 245 may surround and contact a side surface of the first lateral-side passivation layer 240 surrounding the side surface of the second chip 220, a side surface of the first bonding passivation layer 260, and a side surface of the first chip 210. For example, these side surfaces may be coplanar with each other.

In each of the exemplary embodiments of FIGS. 11 and 12, the first chip 210 may include a plurality of identical or different chips disposed in parallel at the same vertical level, and the second chip 220 may also include a plurality of identical or different chips disposed in parallel at the same level.

Referring to FIG. 11, the semiconductor stack 2B according to the illustrated exemplary embodiment of the disclosure may further include a plurality of second bonding pads 255 and a second bonding passivation layer 265 disposed between the first chip 210 and the third chip 230. In an embodiment, the first chip 210 may be disposed over the third chip 230, and the second chip 220 may be disposed over the first chip 210. In an embodiment, an upper surface of the first chip 210 may have a greater area than a lower surface of the second chip 220. An upper surface of the third chip 230 may have a greater area than a lower surface of the first chip 210. A portion of the second bonding passivation layer 265 may be disposed between the second lateral-side passivation layer 245 and the third chip 230. In this case, the first chip 210 or the second lateral-side passivation layer 245 may include a via for electrical connection among the semiconductor chips.

Referring to FIG. 12, the semiconductor stack 2C according to the illustrated exemplary embodiment of the disclosure may further include a plurality of second bonding pads 255 and a second bonding passivation layer 265 disposed between the second chip 220 and the third chip 230. In an embodiment, the second chip 220 may be disposed over the third chip 230, and the first chip 210 may be disposed over the second chip 220. In an embodiment, a lower surface of the first chip 210 may have a greater area than an upper surface of the second chip 220. An upper surface of the third chip 230 may have a greater area than a lower surface of the second chip 220. A portion of the second bonding passivation layer 265 may be disposed between the second lateral-side passivation layer 245 and the third chip 230 and between the first lateral-side passivation layer 240 and the third chip 230. In this case, the second chip 220 or the second lateral-side passivation layer 245 may include a via for electrical connection among the semiconductor chips. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

FIGS. 13 to 22 are views explaining a method for manufacturing semiconductor stacks according to various embodiments of the disclosure.

Figure 13:
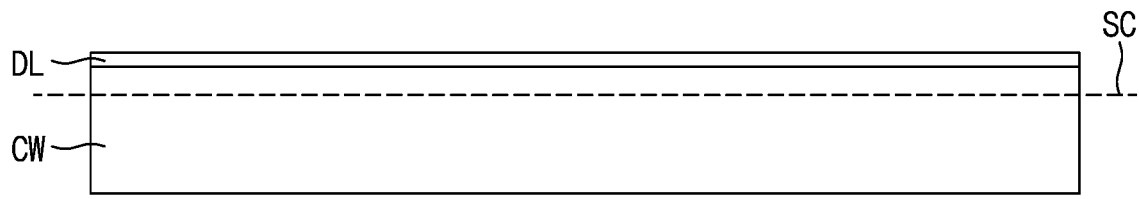
FIGS. 13 to 22 are views explaining a method for manufacturing semiconductor stacks according to various embodiments of the disclosure.

Referring to FIG. 13, the manufacturing method may include forming a dielectric layer DL on a carrier wafer CW including a wafer cutting interface SC. The carrier wafer CW may be formed of or may include silicon. The wafer cutting interface SC may include a smart cutting interface or a stealth cutting interface.

The smart cutting interface (or a SiLT layer) may be a portion of a silicon wafer in which hydrogen (H) ions are implanted. The smart cutting interface, in which hydrogen ions are implanted, exhibits decreased coupling force of silicon crystals. Accordingly, when split force is applied to such a silicon wafer, the wafer may be split at the smart cutting interface. A number of hydrogen (H) ions may remain on the cut surface.

Stealth cutting is a technology for concentrating a laser beam having a wavelength capable of passing through a semiconductor wafer to cut a portion of the inside of a wafer, on which the laser beam is concentrated, without damage to a surface of the wafer. For example, coupling of silicon crystals is broken at an interface subjected to stealth cutting. Accordingly, when force is applied to a silicon wafer in this case, the wafer may be split at the stealth-cut interface. The cut surface may exhibit a different atomic structure from the bulk of the silicon as a result of the laser cutting.

The dielectric layer DL may be formed of or may include nitride or oxide. In an embodiment, the dielectric layer DL may be formed through oxidation of a surface of the carrier wafer CW.

Figure 14:
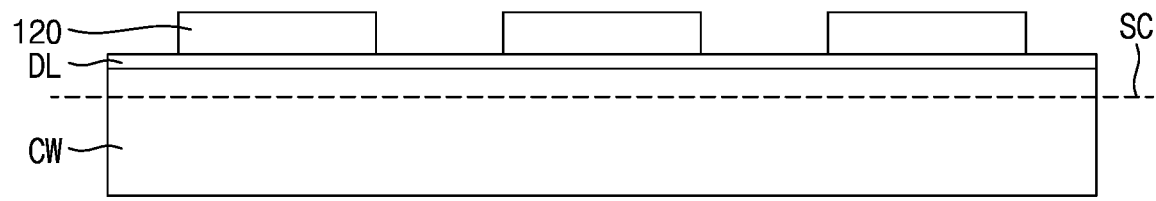

Referring to FIG. 14, the manufacturing method may include bonding the upper chips 120 to (e.g., disposing the upper chips 120 on) an upper surface of the dielectric layer DL. Bonding of the upper chips 120 to the upper surface of the dielectric layer DL may include bonding a plurality of semiconductor chips, which may include chips of different types from each other, to the upper surface of the dielectric layer DL. In one embodiment, only known good die (KGD) ones, described as "known good dies" or "KGDs," of the upper chips 120 to be bonded to the upper surface of the dielectric layer DL are sorted and placed on the upper surface of the dielectric layer DL. In accordance with attachment of the upper chips 120 of KGD, a phenomenon in which degradation in rolled throughput yield caused by wafer bonding may be reduced. In addition, since different kinds of upper chips 120 may be attached, hetero bonding between different chips may be achieved.

Bonding of the upper chips 120 to the upper surface of the dielectric layer DL may be achieved through fusion bonding and without an adhesive layer. In an exemplary embodiment of the disclosure, the dielectric layer DL, which includes oxide, and a back surface of each upper chip 120 may be bonded to each other in an oxide-to-oxide fusion bonding manner. For fusion bonding, the back surface of each upper chip 120 may be oxidized. An adhesive such as a die attach film (DAF) is made of a polymer capable of withstanding a temperature of up to about 250° C. Accordingly, when the upper chips 120 are attached to the carrier wafer CW using an adhesive, the temperature in a subsequent process is limited to 250° C. On the contrary, fusion bonding is coupling of oxides and, as such, may withstand a temperature of up to about 450° C. Accordingly, when the upper chips 120 are attached to the carrier wafer CW through fusion bonding, temperature limit of a subsequent process may be alleviated to 450° C. or less.

Figure 15A:
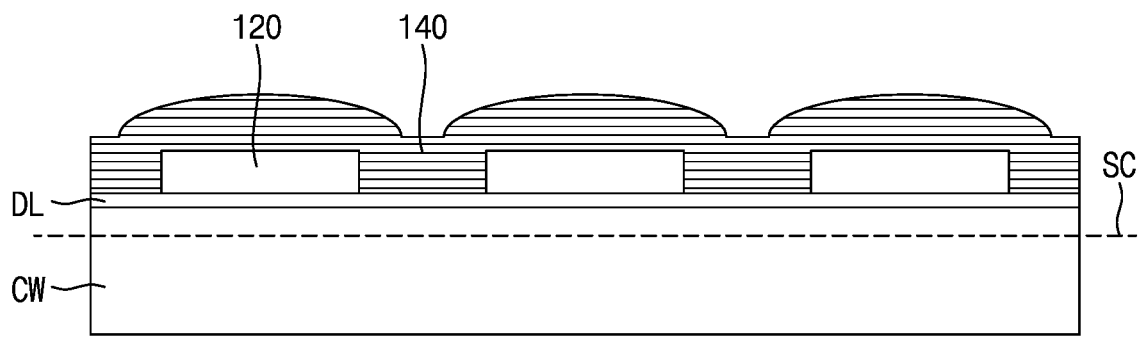

Referring to FIG. 15A, the manufacturing method may include forming an upper lateral-side passivation layer 140 covering the upper surface of the dielectric layer DL and the upper chips 120. The upper lateral-side passivation layer 140 may be formed through a deposition process, and may be or may include an oxide such as $SiO_2$ or a nitride such as SiN or SiCN. Alternatively, the upper lateral-side passivation layer 140 may be formed through spin coating, and may be or may include a polyimide, SiLK, or spin-on-glass (SOG) passivation layer. In the process of forming the upper lateral-side passivation layer 140, spaces between the upper chips 120 are filled with a passivation layer that contacts side surfaces of the upper chips 120.

Figure 15B:
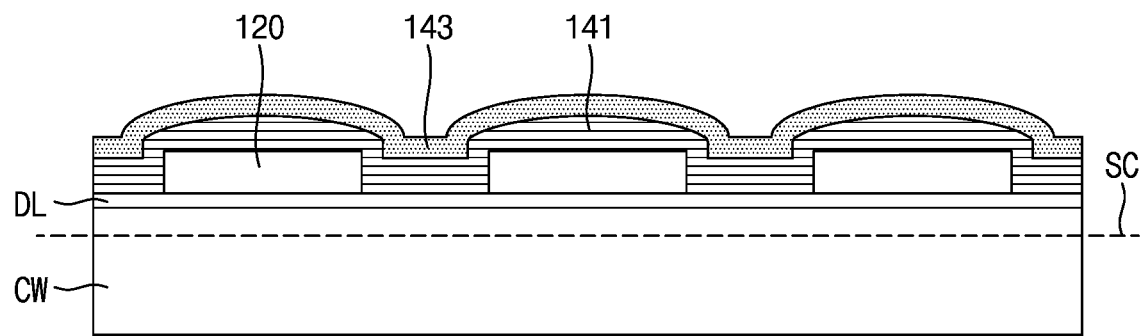

Referring to FIG. 15B, formation of the upper lateral-side passivation layer 140 covering the upper surface of the dielectric layer DL and the upper chips 120 may include forming a first upper lateral-side passivation layer 141 covering the upper surface of the dielectric layer DL and the upper chips 120, and forming a second upper lateral-side passivation layer 143 covering the first upper lateral-side passivation layer 141. The upper lateral-side passivation layers 141 and 143, which are constituted by a multilayer structure of two or more layers, may be formed through repeated execution of a deposition process or a spin coating process or alternating execution of the processes, and may include the respective materials described above in connection with those processes.

Figure 16:
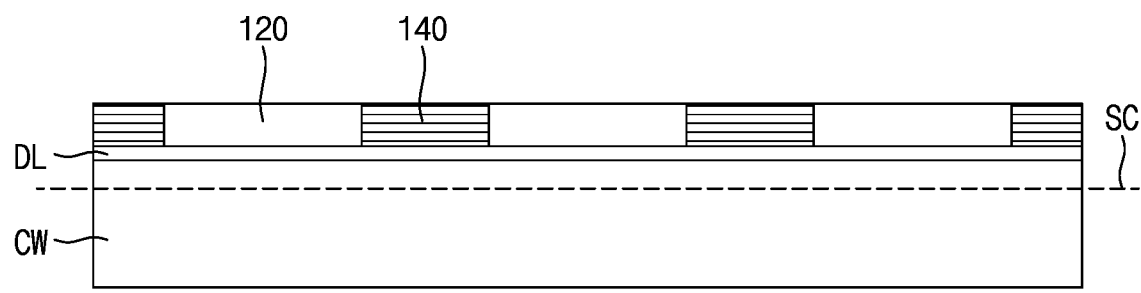

Referring to FIG. 16, the manufacturing method may include removing a portion of the upper lateral-side passivation layer 140, thereby exposing upper surfaces of the upper chips 120. In an embodiment, when different kinds of upper chips 120 are included, a part of the upper chips 120 (e.g., one or more of the upper chips 120), which has a relatively small height, may not be exposed at the upper surface thereof. Removal of a portion of the upper lateral-side passivation layer 140 may be carried out through a chemical mechanical polishing (CMP) process or a grinding process. In an exemplary embodiment of the disclosure, as a portion of the upper lateral-side passivation layer 140 is removed, an upper surface of the resultant structure may be flat. Accordingly, a bonding interface for wafer bonding may be controlled to be flat.

Figure 17:
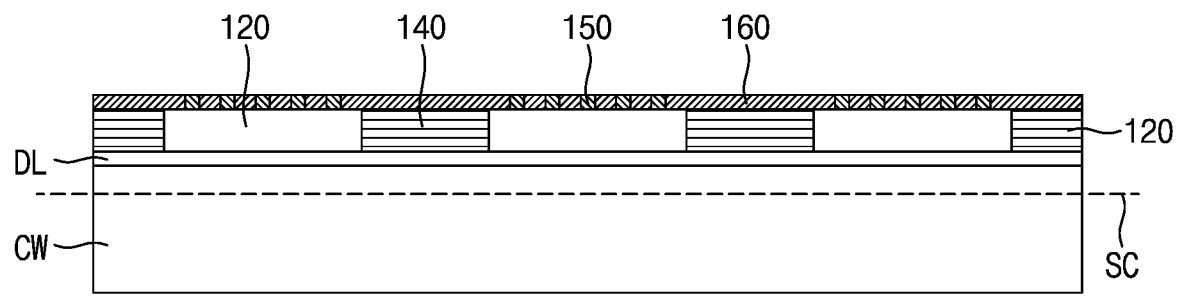

Referring to FIG. 17, the manufacturing method may include forming a plurality of bonding pads 150 and a bonding passivation layer 160 on the exposed upper surfaces of the upper chips 120 and the upper surface of the upper lateral-side passivation layer 140. In this manner, a first layer including a plurality of first external bonding pads (e.g., bonding pads 150 for communicating externally from first semiconductor chips, such as the upper chips 120) and a first bonding passivation layer (e.g., 160) is formed with the first semiconductor chips. The bonding pads 150 may be electrically connected to corresponding ones of the upper chips 120. The bonding passivation layer 160 may insulate the bonding pads 150 from one another. In an embodiment, the bonding pads 150 may also be disposed on the upper lateral-side passivation layer 140. In an embodiment, formation of the plurality of bonding pads 150 and the bonding passivation layer 160 on the exposed upper surfaces of the upper chips 120 and the upper surface of the upper lateral-side passivation layer 140 may include forming the plurality of bonding pads 150 and the bonding passivation layer 160 through a redistribution layer (RDL) formation process in a fabrication (FAB) process. The bonding pads 150 may therefore be part of or may be connected to wiring layers that pass between the upper chips 120 and later-disposed chips to redistribute signals between and electrically connect the chips. The wiring layers may also connect different bonding pads 150 on respective upper chips 120 to pass signals between and electrically connect two or more of the upper chips 120.

Figure 18:
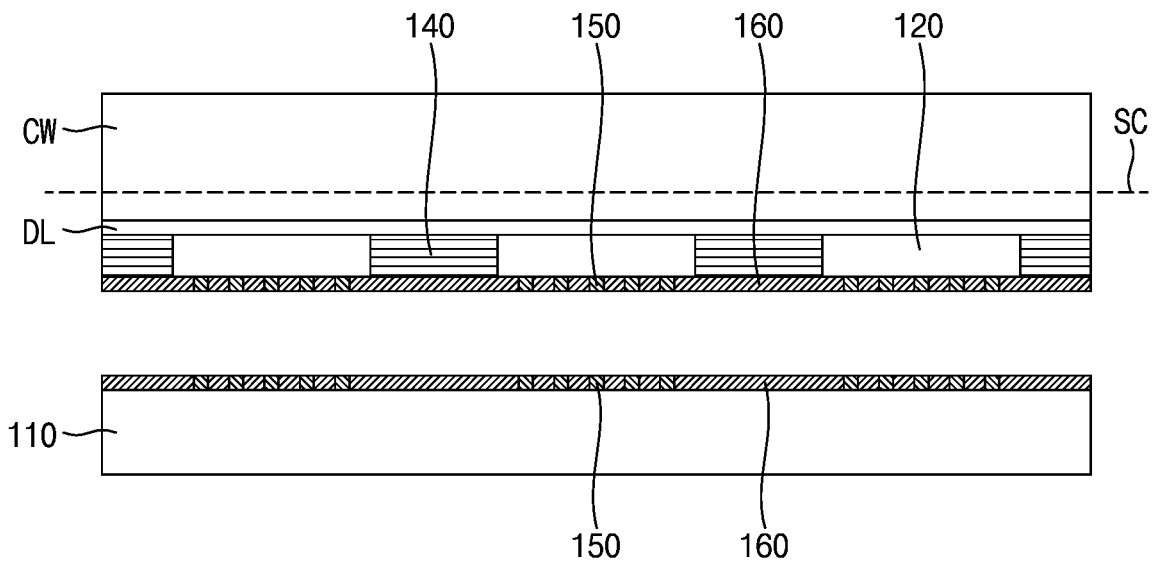
Figure 19:
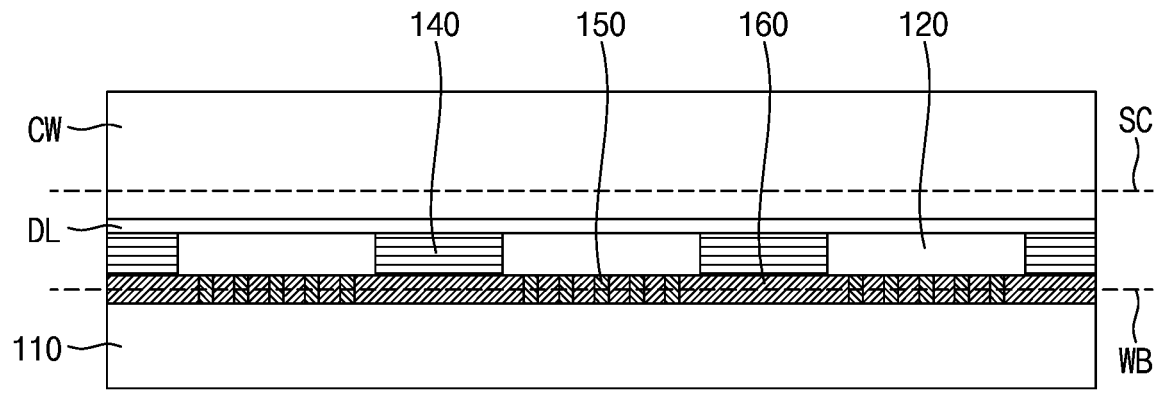

Referring to FIGS. 18 and 19, the manufacturing method may include inverting (e.g., flipping) the carrier wafer CW including the dielectric layer DL, the upper chips 120, the upper lateral-side passivation layer 140, the bonding pads 150 and the bonding passivation layer 160, and disposing the inverted structure on a lower wafer including a lower chip 110, bonding pads 150 and a bonding passivation layer 160 in a wafer-to-wafer bonding manner. The lower wafer may include a plurality of lower chips 110 horizontally adjacent to each other. Wafer-to-wafer bonding between the carrier wafer CW, on which the upper chips 120 are disposed, and the lower wafer including the lower chip 110 may include hybrid bonding including bonding the bonding pads 150 disposed at one surface of the upper chips 120 or the upper lateral-side passivation layer 140 and the bonding pads 150 disposed at one surface of the lower chip 110 in a C2C bonding manner, and bonding the bonding passivation layer 160 disposed at one surface of each upper chip 120 and one surface of the upper lateral-side passivation layer 140 and the bonding passivation layer 160 disposed at one surface of the lower chip 110 in a dielectric-to-dielectric (D2D) bonding manner. As a result, a wafer level stacked structure may be formed. Note that spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

Figure 20:
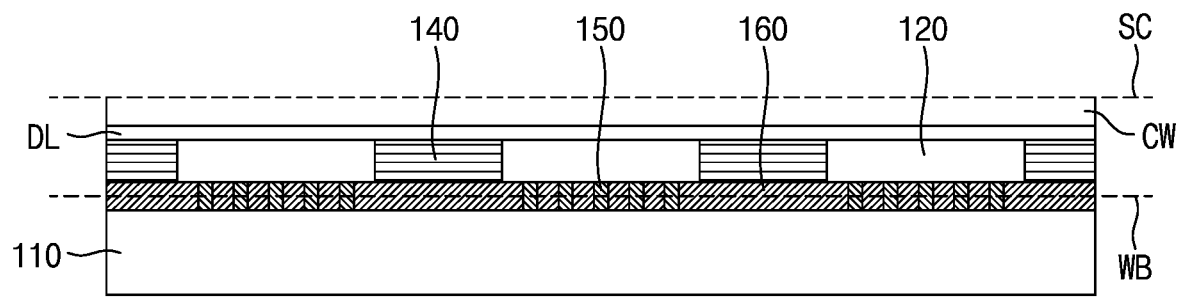
Figure 21:
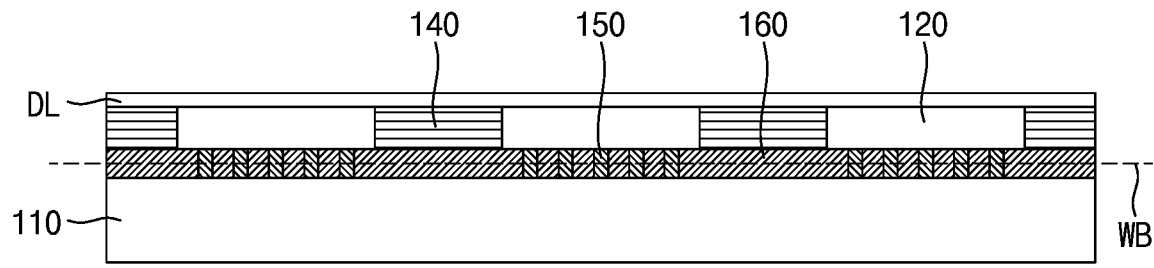
Figure 22:
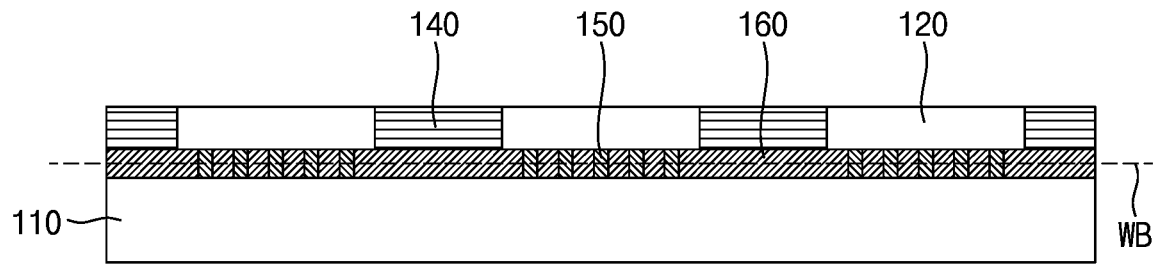

Referring to FIGS. 20 to 22, the manufacturing method may include removing a part of a backside portion of the resultant structure. Referring to FIG. 20, removal of a part of the backside portion of the resultant structure may include removing a portion of the carrier wafer CW. In an exemplary embodiment of the disclosure, the carrier wafer CW may include a wafer cutting interface SC including a smart cutting interface or a stealth cutting interface. Accordingly, it may be possible to split the carrier wafer CW at the wafer cutting interface (SC) level by applying force to the carrier wafer CW. In an embodiment, the manufacturing method may further include grinding or chemical mechanical polishing (CMP) the split wafer cutting interface SC, thereby flattening an upper surface of the remaining portion of the carrier wafer CW. Meanwhile, the carrier wafer CW, which is removed through splitting thereof at the wafer cutting interface (SC) level, may be reused, differently from the case in which the carrier wafer CW is removed through grinding.

Referring to FIG. 21, removal of a portion of the backside of the resultant structure may include removing the entire portion of the carrier wafer CW. For example, it may be possible to completely remove the remaining portion of the carrier wafer CW by grinding or chemical mechanical polishing (CMP) the split wafer cutting interface SC formed through application of force. When the carrier wafer CW is completely removed, the upper surface of the dielectric layer DL may be exposed.

Referring to FIG. 22, removal of a portion of the backside of the resultant structure may include removing the entire portion of the carrier wafer CW and the entire portion of the dielectric layer DL. For example, it may be possible to completely remove the remaining portion of the carrier wafer CW by grinding or chemical mechanical polishing (CMP) the split wafer cutting interface SC formed through application of force, and then additionally removing the entire portion of the dielectric layer DL. In this case, the upper surfaces of the upper chips 120 and the upper surface of the upper lateral-side passivation layer 140 may be exposed.

Subsequently, the manufacturing method may include dicing the resultant structure into individual semiconductor stacks. When the bonded wafer of FIG. 20 is diced, the semiconductor stack 1H of FIG. 8 may be formed. When the bonded wafer of FIG. 21 is diced, the semiconductor stack 1G of FIG. 7 may be formed. When the bonded wafer of FIG. 22 is diced, the semiconductor stack 1A of FIG. 4 may be formed.

In an embodiment, the semiconductor stack manufacturing method according to the disclosure may manufacture a multilayer semiconductor stack of three layers or more through repeated execution thereof. For example, again referring to FIGS. 4, 22 and 10, when the manufacturing method of the disclosure is executed while again using the semiconductor stack 1A produced through dicing in step of FIG. 22 as the lower chip 110 of FIG. 4, the semiconductor stack 2A of FIG. 10 may be produced. In another example, again referring to FIGS. 4, 22 and 11, when the manufacturing method of the disclosure is executed while again using the semiconductor stack 1A produced through dicing in step of FIG. 22 as the upper chip 120 of FIG. 4, the semiconductor stack 2B of FIG. 11 may be produced. Finally, in another example, again referring to FIGS. 4, 22 and 12, when the manufacturing method of the disclosure is executed while again using the semiconductor stack 1A produced through dicing in step of FIG. 22 as the upper chip 120 of FIG. 4, under the condition that the semiconductor stack 1A is inverted, the semiconductor stack 2C of FIG. 12 may be produced. The multilayer semiconductor stack manufactured through repeated execution of the manufacturing method of the disclosure may further include an upper backside passivation layer 170 and an upper backside silicon layer 180 disposed over the uppermost chip in accordance with an embodiment.

In accordance with exemplary embodiments of the disclosure, only upper chips 120 having no defect are sorted and attached to the carrier wafer CW, and the upper lateral-side passivation layer 140 is disposed at side surfaces of the upper chips 120 while being filled between adjacent ones of the upper chips 120, and, as such, it may be possible to control the wafer bonding interface to be flat and to achieve an enhancement in rolled throughput yield. In addition, a redistribution layer formation process may be conducted on upper surfaces of the upper chips 120 and, as such, hetero bonding between different kinds of chips may be possible. Furthermore, disposition of the bonding pads 150 may be extended to the upper surface of the upper lateral-side passivation layer 140 disposed at side surfaces of the upper chips 120. In addition, the carrier wafer CW, which includes a wafer cutting interface enabling smart cutting or stealth cutting, is used, and, as such, it may be possible to eliminate use of an adhesive upon attaching the upper chips 120 to the carrier wafer CW, thereby enabling a desired process to be carried out at a higher temperature. Furthermore, reuse of the split carrier wafer CW may be possible.

The semiconductor chips described herein may be, for example, memory chips having a memory array stored thereon, or logic chips, such as controller chips or microprocessors, or peripheral circuitry. For example, a bottom chip in the stack may be logic chip and the top chip in the stack may be a memory chip, or vice versa. Or both chips bonded to each other may be the same type of chip. The semiconductor chips may be part of a flip-bonded package, including, for example, chips electrically connected to each other using flip chip direct bonding (e.g., without using balls or bumps to electrically connect the chips to each other).

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor stack comprising:
    a lower chip;
    an upper chip disposed over the lower chip;
    an upper lateral-side passivation layer surrounding side surfaces of the upper chip and having a bottom surface coplanar with a bottom surface of the upper chip; and
    a plurality of bonding pads and a bonding passivation layer disposed between the upper chip and the lower chip and including a set of first bonding pads for the upper chip respectively directly bonded to a set of second bonding pads for the lower chip, and including a first bonding passivation layer for the upper chip bonded to a second bonding passivation layer for the lower chip.

2. The semiconductor stack according to claim 1, wherein the upper lateral-side passivation layer has the form of a frame when viewed in a top-down view, and four edges of the frame have different widths, respectively.

3. The semiconductor stack according to claim 1, wherein:
    the upper chip comprises a first upper semiconductor chip and a second upper semiconductor chip; and
    the first upper semiconductor chip and the second upper semiconductor chip comprise different types of semiconductor chips, respectively.

4. The semiconductor stack according to claim 3, wherein the first upper semiconductor chip and the second upper semiconductor chip are redistributed and electrically connected through the plurality of bonding pads.

5. The semiconductor stack according to claim 1, wherein:
    the upper chip comprises a first upper semiconductor chip, a second upper semiconductor chip, a third upper semiconductor chip, and a fourth upper semiconductor chip all at the same vertical level above the lower chip; and
    at least one pair of the first upper semiconductor chip, the second upper semiconductor chip, the third upper semiconductor chip, and the fourth upper semiconductor chip comprises identical semiconductor chips.

6. The semiconductor stack according to claim 1, further comprising:
    an upper backside passivation layer disposed over the upper chip and the upper lateral-side passivation layer.

7. The semiconductor stack according to claim 6, further comprising:
    an upper backside silicon layer disposed over the upper backside passivation layer.

8. The semiconductor stack according to claim 1, wherein:
    the upper lateral-side passivation layer comprises a first upper lateral-side passivation layer and a second upper lateral-side passivation layer; and
    the first upper lateral-side passivation layer surrounds one side surface of the second upper lateral-side passivation layer and an upper surface of the second upper lateral-side passivation layer when viewed in vertical cross-section.

9. The semiconductor stack according to claim 8, wherein each of the first upper lateral-side passivation layer and the second upper lateral-side passivation layer comprises one of $SiO_2$, SiN, or SiCN.

10. The semiconductor stack according to claim 8, wherein the upper lateral-side passivation layer further comprises a seam disposed at a portion of the second upper lateral-side passivation layer.

11. The semiconductor stack according to claim 1, wherein:
    the upper lateral-side passivation layer comprises a first upper lateral-side passivation layer and a second upper lateral-side passivation layer; and
    the first upper lateral-side passivation layer is disposed beneath the second upper lateral-side passivation layer when viewed in vertical cross-section.

12. The semiconductor stack according to claim 11, wherein each of the first upper lateral-side passivation layer and the second upper lateral-side passivation layer comprises one of a passivation layer of polyimide, SiLK, or silicon-on-glass (SOG).

13. The semiconductor stack according to claim 1, wherein the plurality of bonding pads are disposed outside an upper chip area in which the upper chip is disposed.

14. The semiconductor stack according to claim 1, wherein the upper lateral-side passivation layer comprises a passivation layer of $SiO_2$, SiN, SiCN, polyimide, SiLK or silicon-on-glass (SOG).

15. A semiconductor stack comprising:
    a first chip;
    a second chip disposed over the first chip;
    a first lateral-side passivation layer surrounding a side surface of the second chip;
    a plurality of first bonding pads and a first bonding passivation layer disposed between the first chip and the second chip, including a set of first bonding pads for the first chip respectively directly bonded to a set of second bonding pads for the second chip, and including a first bonding passivation layer for the first chip directly bonded to a second bonding passivation layer for the second chip;
    a third chip disposed over the second chip;
    a second lateral-side passivation layer surrounding a side surface of the third chip; and
    a plurality of bonding pads and an additional bonding passivation layer disposed between the second chip and the third chip.

16. The semiconductor stack according to claim 15, wherein:
the second chip comprises a plurality of chips including one or more different types of semiconductor chips; and
the third chip comprises a plurality of chips including one or more different types of semiconductor chips.

17. A semiconductor stack comprising:
a first chip, a second chip, and a third chip stacked on one another;
a first lateral-side passivation layer surrounding a side surface of the second chip and having a top and bottom surface coplanar with a respective top and bottom surface of the second chip;
a plurality of first bonding pads and a first bonding passivation layer disposed between the first chip and the second chip; and
a second lateral-side passivation layer surrounding a side surface of the first lateral-side passivation layer surrounding the side surface of the second chip, a side surface of the first bonding passivation layer, and a side surface of the first chip.

18. The semiconductor stack according to claim 17, wherein:
the first chip is disposed over the third chip;
the second chip is disposed over the first chip; and
the semiconductor stack further comprises a plurality of second bonding pads and a second bonding passivation layer disposed between the first chip and the third chip.

19. The semiconductor stack according to claim 17, wherein:
the second chip is disposed over the third chip;
the first chip is disposed over the second chip; and
the semiconductor stack further comprises a plurality of second bonding pads and a second bonding passivation layer disposed between the second chip and the third chip.

20. The semiconductor stack according to claim 17, wherein:
the first chip comprises a plurality of chips including one or more different types of semiconductor chips; and
the second chip comprises a plurality of chips including one or more different types of semiconductor chips.

21. The semiconductor stack according to claim 17, wherein:
a lateral side surface of the first lateral-side passivation layer contacts the side surface of the second chip.

* * * * *